United States Patent
Chang et al.

(10) Patent No.: US 11,232,979 B2
(45) Date of Patent: Jan. 25, 2022

(54) METHOD OF FORMING TRENCHES

(71) Applicant: Taiwan Semiconductor Manufacturing Company, Ltd., Hsin-Chu (TW)

(72) Inventors: Che-Cheng Chang, New Taipei (TW); Chih-Han Lin, Hsinchu (TW)

(73) Assignee: TAIWAN SEMICONDUCTOR MANUFACTURING COMPANY, LTD, Hsinchu (TW)

( * ) Notice: Subject to any disclaimer, the term of this patent is extended or adjusted under 35 U.S.C. 154(b) by 0 days.

(21) Appl. No.: 16/048,016

(22) Filed: Jul. 27, 2018

(65) Prior Publication Data
US 2018/0350667 A1 Dec. 6, 2018

Related U.S. Application Data

(62) Division of application No. 15/019,779, filed on Feb. 9, 2016, now Pat. No. 10,535,558.

(51) Int. Cl.
*H01L 23/522* (2006.01)
*H01L 21/768* (2006.01)
(Continued)

(52) U.S. Cl.
CPC .. *H01L 21/76831* (2013.01); *H01L 21/76811* (2013.01); *H01L 21/76877* (2013.01);
(Continued)

(58) Field of Classification Search
CPC ........... H01L 23/5226; H01L 21/76832; H01L 21/76846; H01L 21/76844;
(Continued)

(56) References Cited

U.S. PATENT DOCUMENTS 6,140,226 A   10/2000  Grill et al.
6,930,038 B2 *   8/2005  Lin ................... H01L 21/76808
257/E21.579
(Continued)

FOREIGN PATENT DOCUMENTS

CN         1434509        8/2003
CN        101937902      1/2011
(Continued)

*Primary Examiner* — Mary A Wilczewski
*Assistant Examiner* — Tsz K Chiu
(74) *Attorney, Agent, or Firm* — Haynes and Boone, LLP

(57) ABSTRACT

Methods are disclosed herein that improve contours of trenches formed when fabricating vias and conductive lines of a multi-layer interconnect (MLI) structure. An exemplary device that can result from such methods includes a via of an MLI structure and a conductive line of the MLI structure disposed over the via. A first dielectric liner layer is disposed along sidewalls of the via and sidewalls of the conductive line. A thickness of the first dielectric liner layer is substantially the same along the sidewalls of the via. A thickness of the first dielectric liner layer increases along the sidewalls of the conductive line, such that the first dielectric liner layer has a tiger-tooth shape at each bottom corner of the conductive line. A second dielectric liner layer is disposed along the first dielectric liner layer that is disposed along the sidewalls of the via.

20 Claims, 9 Drawing Sheets

(51) Int. Cl.
*H01L 23/528* (2006.01)
*H01L 23/532* (2006.01)

(52) U.S. Cl.
CPC ........ *H01L 23/528* (2013.01); *H01L 23/5226* (2013.01); *H01L 23/53295* (2013.01); *H01L 21/76832* (2013.01)

(58) Field of Classification Search
CPC ......... H01L 21/76805; H01L 23/53238; H01L 23/53295; H01L 2924/0002; H01L 2924/3011; H01L 45/1683; H01L 2221/1021; H01L 2221/1031; H01L 2221/1036; H01L 2224/05006; H01L 21/76831; H01L 23/528; H01L 21/76877; H01L 21/76807–76813; H01L 2221/1015–1036; H01L 2224/05546
See application file for complete search history.

(56) References Cited

U.S. PATENT DOCUMENTS

| | | | |
|---|---|---|---|
| 7,544,982 B2* | 6/2009 | Yu | H01L 27/14627 257/294 |
| 7,667,271 B2 | 2/2010 | Yu et al. | |
| 7,875,488 B2* | 1/2011 | Hong | H01L 27/14632 438/71 |
| 7,910,453 B2 | 3/2011 | Xu et al. | |
| 7,923,762 B2* | 4/2011 | Nagaoka | H01L 29/66545 257/288 |
| 8,134,234 B2* | 3/2012 | Isobayashi | H01L 21/76805 257/751 |
| 8,377,779 B1 | 2/2013 | Wang | |
| 8,399,931 B2 | 3/2013 | Liaw et al. | |
| 8,634,231 B2* | 1/2014 | Li | H01L 43/08 365/158 |
| 8,652,894 B2 | 2/2014 | Lin et al. | |
| 8,686,516 B2 | 4/2014 | Chen et al. | |
| 8,716,765 B2 | 5/2014 | Wu et al. | |
| 8,723,272 B2 | 5/2014 | Liu et al. | |
| 8,729,627 B2 | 5/2014 | Cheng et al. | |
| 8,735,993 B2 | 5/2014 | Lo et al. | |
| 8,736,056 B2 | 5/2014 | Lee et al. | |
| 8,772,109 B2 | 7/2014 | Colinge | |
| 8,785,285 B2 | 7/2014 | Tsai et al. | |
| 8,816,444 B2 | 8/2014 | Wann et al. | |
| 8,823,065 B2 | 9/2014 | Wang et al. | |
| 8,860,148 B2 | 10/2014 | Hu et al. | |
| 8,981,422 B2* | 3/2015 | Takeuchi | H01L 27/0207 257/128 |
| 9,490,165 B2* | 11/2016 | Du | H01L 21/76835 |
| 9,536,826 B1* | 1/2017 | Chang | H01L 21/76877 |
| 9,728,501 B2* | 8/2017 | Chang | H01L 21/31111 |
| 10,158,073 B2* | 12/2018 | Chou | H01L 27/2436 |
| 2003/0160327 A1* | 8/2003 | Usui | H01L 23/5329 257/758 |
| 2004/0017011 A1 | 1/2004 | Narita et al. | |
| 2008/0061341 A1* | 3/2008 | Lung | G11C 11/5678 257/303 |
| 2008/0171434 A1 | 7/2008 | Chang et al. | |
| 2008/0182406 A1 | 7/2008 | Preusse et al. | |
| 2010/0230815 A1* | 9/2010 | Tsao | H01L 23/5226 257/751 |
| 2012/0202333 A1* | 8/2012 | Breitwisch | H01L 45/06 438/381 |
| 2014/0001574 A1 | 1/2014 | Chen et al. | |
| 2014/0110755 A1 | 4/2014 | Colinge | |
| 2014/0151812 A1 | 6/2014 | Liaw | |
| 2015/0372056 A1 | 12/2015 | Seong et al. | |

FOREIGN PATENT DOCUMENTS

| TW | 516180 | 1/2003 |
|---|---|---|
| TW | 200509297 | 3/2005 |
| TW | 200539304 | 12/2005 |
| TW | 201130050 | 9/2011 |

\* cited by examiner

METHOD OF FORMING TRENCHES

This is a divisional application of U.S. patent application Ser. No. 15/019,779, filed Feb. 9, 2016, which is incorporated herein by reference in its entirety.

BACKGROUND

The semiconductor integrated circuit (IC) industry has experienced rapid growth. Technological advances in IC design and material have produced generations of ICs where each generation has smaller and more complex circuits than previous generation. In the course of IC evolution, functional density (i.e., the number of interconnected devices per chip area) has generally increased while geometry size (i.e., the smallest component (or line) that can be created using a fabrication process) has decreased.

This scaling down process generally provides benefits by increasing production efficiency and lowering associated costs. Such scaling down has also increased the complexity of IC processing and manufacturing. For these advances to be realized, similar developments in IC processing and manufacturing are needed. When a semiconductor device such as a metal-oxide-semiconductor field-effect transistor (MOSFET) is scaled down through various technology nodes, interconnects of conductive lines and associated dielectric materials that facilitate wiring between the transistors and other devices play a more important role in IC performance improvement. Although existing methods of fabricating IC devices have been generally adequate for their intended purposes, they have not been entirely satisfactory in all respects. For example, there are challenges associated with forming trenches in interconnection structures.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
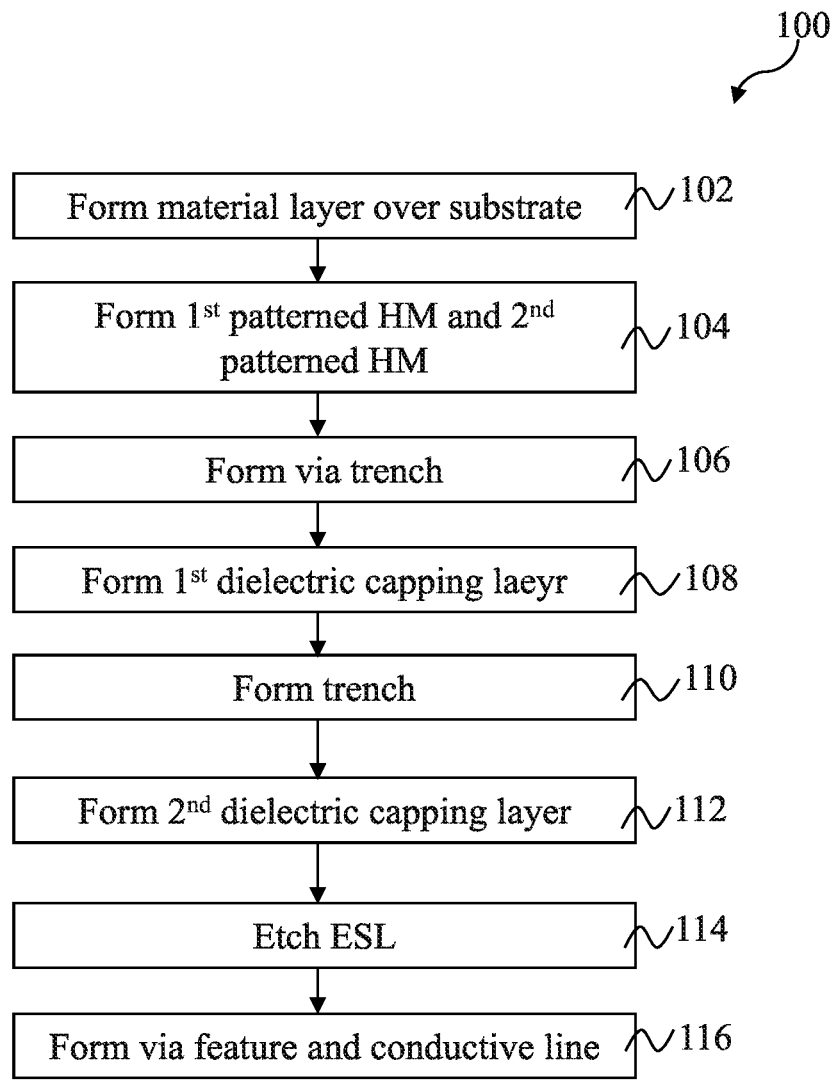
FIG. 1 is a flow chart of a method of fabricating a device or portion provided according to one or more aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a flowchart of one embodiment of a method 100 of fabricating one or more semiconductor devices according to aspects of the present disclosure. The method 100 is discussed in detail below, with reference to a semiconductor device precursor 200 shown in FIGS. 2, 3, 4, 5, 6, 7, 8A and 8B for the sake of example. It is understood that additional steps can be provided before, during, and/or after the method, and some of the steps described can be replaced or eliminated for other embodiments of the method.

Figure 2:
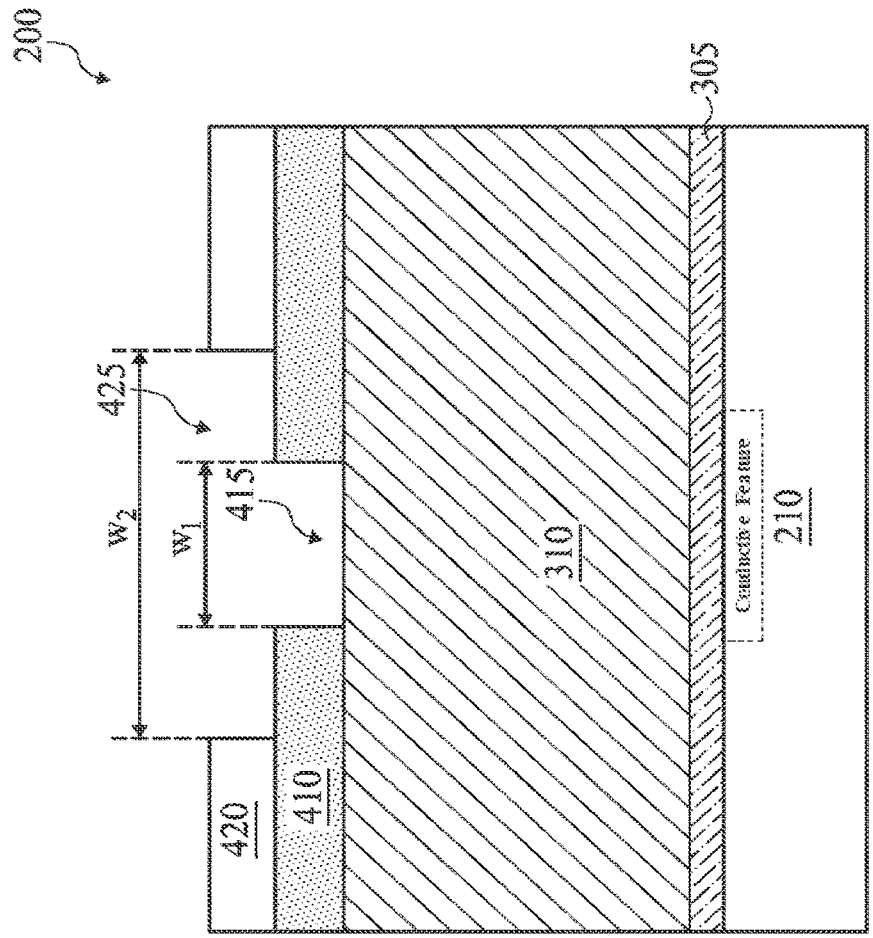
FIGS. 2, 3, 4, 5, 6, 7, 8A and 8B are cross-section views of an embodiment of a device 200 according to aspects of the method of FIG. 1

Referring to FIGS. 1 and 2, the method 100 begins at step 102 by forming a material layer 310 over a substrate 210. The substrate 210 may include silicon. Alternatively or additionally, the substrate 210 may include other elementary semiconductor such as germanium. The substrate 210 may also include a compound semiconductor such as silicon carbide, gallium arsenic, indium arsenide, and indium phosphide. The substrate 210 may include an alloy semiconductor such as silicon germanium, silicon germanium carbide, gallium arsenic phosphide, and gallium indium phosphide. In one embodiment, the substrate 210 includes an epitaxial layer. For example, the substrate 210 may have an epitaxial layer overlying a bulk semiconductor. Furthermore, the substrate 210 may include a semiconductor-on-insulator (SOI) structure. For example, the substrate 210 may include a buried oxide (BOX) layer formed by a process such as separation by implanted oxygen (SIMOX) or other suitable technique, such as wafer bonding and grinding.

The substrate 210 may also include various p-type doped regions and/or n-type doped regions, implemented by a process such as ion implantation and/or diffusion. Those doped regions include n-well, p-well, light doped region (LDD), heavily doped source and drain (S/D), and various channel doping profiles configured to form various IC devices, such as a complimentary metal-oxide-semiconductor field-effect transistor (CMOSFET), imaging sensor, and/or light emitting diode (LED).

The substrate 210 may also include various isolation features. The isolation features separate various device regions in the substrate 210. The isolation features include different structures formed by using different processing technologies. For example, the isolation features may include shallow trench isolation (STI) features. The formation of a STI may include etching a trench in the substrate 210 and filling in the trench with insulator materials such as silicon oxide, silicon nitride, or silicon oxynitride. The filled trench may have a multi-layer structure such as a thermal oxide liner layer with silicon nitride filling the trench. A chemical mechanical polishing (CMP) may be performed to polish back excessive insulator materials and planarize the top surface of the isolation features.

The substrate 210 may also include one more conductive features (e.g., lines or vias) formed thereon. The conductive features may form a portion of an interconnect structure referred to as a multi-layer interconnect (MLI) typically including a plurality of conductive layers (referred to as metal layers), contacts, and/or vias providing an interconnection of the conductive layers and/or other conductive features. As used herein the term "via" may include a contact feature. Depending on the layer level, the vias may provide connection to the conductive lines (wiring), connection between conductive lines (metal wiring), connection to doped regions, connection to a gate of transistor, connection to a plate of capacitor, and/or connection to other features of a semiconductor device or integrated circuit. The conductive features of the MLI may include barrier or liner layers. In an embodiment, the conductive features include aluminum (Al), copper (Cu), tungsten (W), respective alloys, combinations thereof, and/or other suitable conductive material. The conductive features may also include silicide features, for example, disposed on source, drain, or gate structures of a semiconductor device.

The method 100 may be used to form a portion of the MLI structure discussed above. In other words, the conductive lines and vias (which include contacts) of an MLI may be formed using one or more of the steps of the method 100.

The material layer 310 may include silicon oxide, undoped or doped silicate glasses, such as boron phosphate silicate glass (BPSG), phosphate silicate glass (PSG), undoped or doped thermally grown silicon oxide, undoped or doped TEOS deposited silicon oxide, organic-silicate glass, porous low-k materials, and/or other suitable dielectric materials. In some embodiments, the material layer 310 includes extra-low k (ELK) dielectric. Suitable extra-low k material may include fluorinated silica glass (FSG), carbon doped silicon oxide, Black Diamond® (Applied Materials of Santa Clara, Calif.), Xerogel, Aerogel, amorphous fluorinated carbon, Parylene, bis-benzocyclobutenes (BCB), SILK (Dow Chemical, Midland, Mich.), polyimide, porous polymer and/or other suitable materials as examples.

In some embodiments, prior to forming the material layer 310, an etch stop layer (ESL) 305 is formed over the substrate 210 and then material layer 310 is formed over the ESL 305. The ESL 305 has an etch selectivity to the material layer 310 and functions to stop etch during subsequent operation to pattern the material layer 310. The ESL 305 may include silicon nitride, silicon oxynitride, silicon carbide, titanium oxide, titanium nitride, tantalum oxide, tantalum nitride, combinations thereof, and/or other suitable materials. In various examples, the ESL 305 and the material layer 310 may be deposited by chemical vapor deposition (CVD), physical vapor deposition (PVD), atomic layer deposition (ALD), thermal oxidation, spin-on coating, combinations thereof, or other suitable techniques.

Referring again to FIGS. 1 and 2, method 100 proceeds to step 104 by forming a first patterned hard mask (HM) 410 over the material layer 310 and a second patterned HM 420 over the first patterned HM 410. The first patterned HM 410 has a first opening 415 with a first width $w_1$ and the second HM 420 has a second opening 515 with a second width $w_2$. In the present embodiment, the second width $w_2$ is greater than the first width $w_1$. In an embodiment, the second width $w_2$ is greater than two times the width of the first width $w_1$. In some embodiments, the first opening 415 defines a via feature and the second opening 425 defines a metal line connecting with the via feature. The first opening 415 may align to a respective conductive feature in the substrate 210 and the second opening 425 connects and aligns to the first opening 415.

The first and second patterned HMs, 410 and 420, may include silicon oxide, silicon nitride, silicon oxynitride, silicon carbide, titanium oxide, titanium nitride, tantalum oxide, tantalum nitride, combinations thereof, and/or other suitable materials. In the present embodiment, the first patterned HM 410 may include a material which is different from the material layer 310 to achieve etching selectivity during subsequent etch processes. The second patterned HM 420 may include a material which is different from the material layer 310 and the first patterned HM 410 to achieve etching selectivity during subsequent etch processes. In an embodiment, the material layer 310 includes extra-low k (ELK) dielectric material, the first patterned HM 410 includes silicon nitride and the second patterned HM 420 includes titanium nitride.

The first and second patterned HMs, 410 and 420, may be formed by processes of deposition, lithography and etch. The deposition process may include CVD, ALD, PVD, thermal oxidation, spin-on coating combinations thereof, and/or other suitable techniques. An exemplary lithography process may include forming a photoresist layer, exposing the photoresist layer by a lithography exposure process, performing a post-exposure bake process, and developing the photoresist layer to form the patterned resist layer. The etching process may include a wet etch, a dry etch, and/or a combination thereof.

Figure 3:
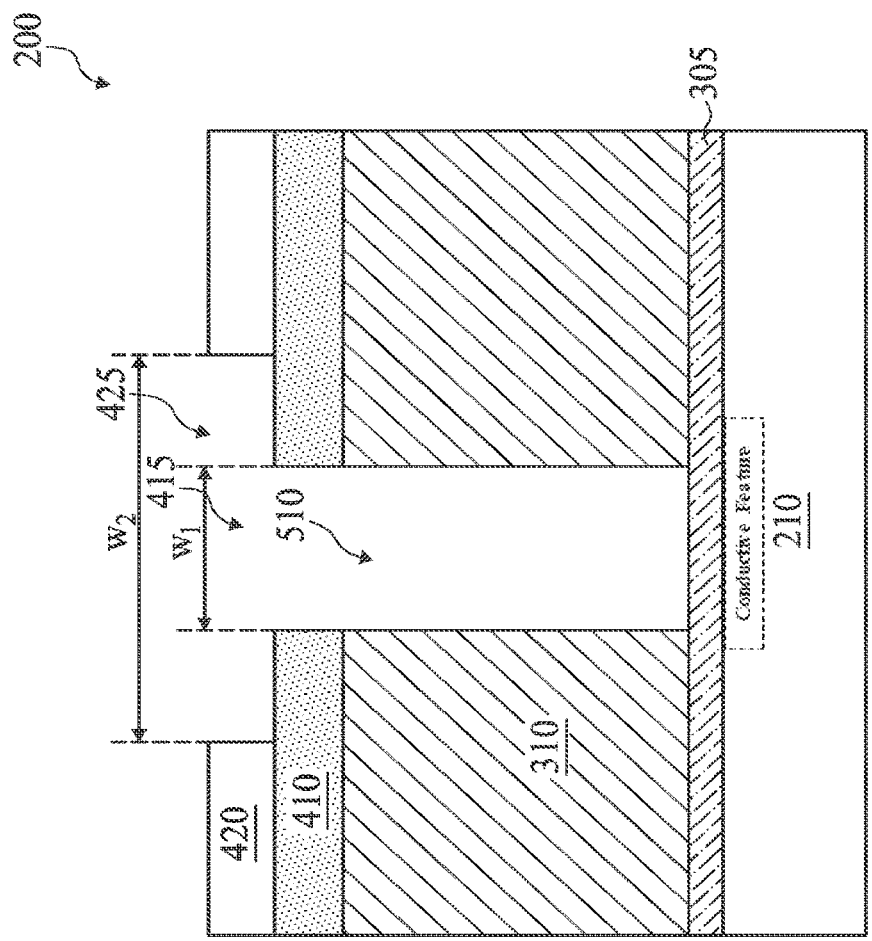

Referring to FIGS. 1 and 3, method 100 proceeds to step 106 by etching the material layer 310 through the first opening 415 to form a via trench 510 (or first trench). In some embodiments, the via trench 510 extends through the material layer 310 down to the ESL 305. The etch process may include a wet etch, a dry etch, and/or a combination thereof. For example, a dry etching process may use chlorine-containing gases, fluorine-containing gases, other etching gases, and/or a combination thereof. The wet etching solutions may include NH$_4$OH (ammonium hydroxide), HF (hydrofluoric acid) or diluted HF, deionized water, TMAH (tetramethylammonium hydroxide), other suitable wet etching solutions, or combinations thereof. The via etch process may be tuned with various etching parameters, such as etchant used, etching temperature, etching solution concentration, etching pressure, etchant flow rate, and/or other suitable parameters. In some embodiments, the etch process is chosen to selectively etch the material layer 310 without substantially etching the first and second patterned HMs, 410 and 420. As has been mentioned previously, the ESL 305 serves as an etch stop layer, which improves etch process window and profile control. In some embodiments, the etch process includes an anisotropic dry etch and thus the via trench 510 is formed with a vertical profile and has a same width as the first opening 415, namely the first width $w_1$. As an example, via etch process may include a plasma dry etching process using a fluorine-based chemistry, such as $CF_4$, $SF_6$, $CH_2F_2$, $CHF_3$, and/or $C_2F_6$.

Figure 4:
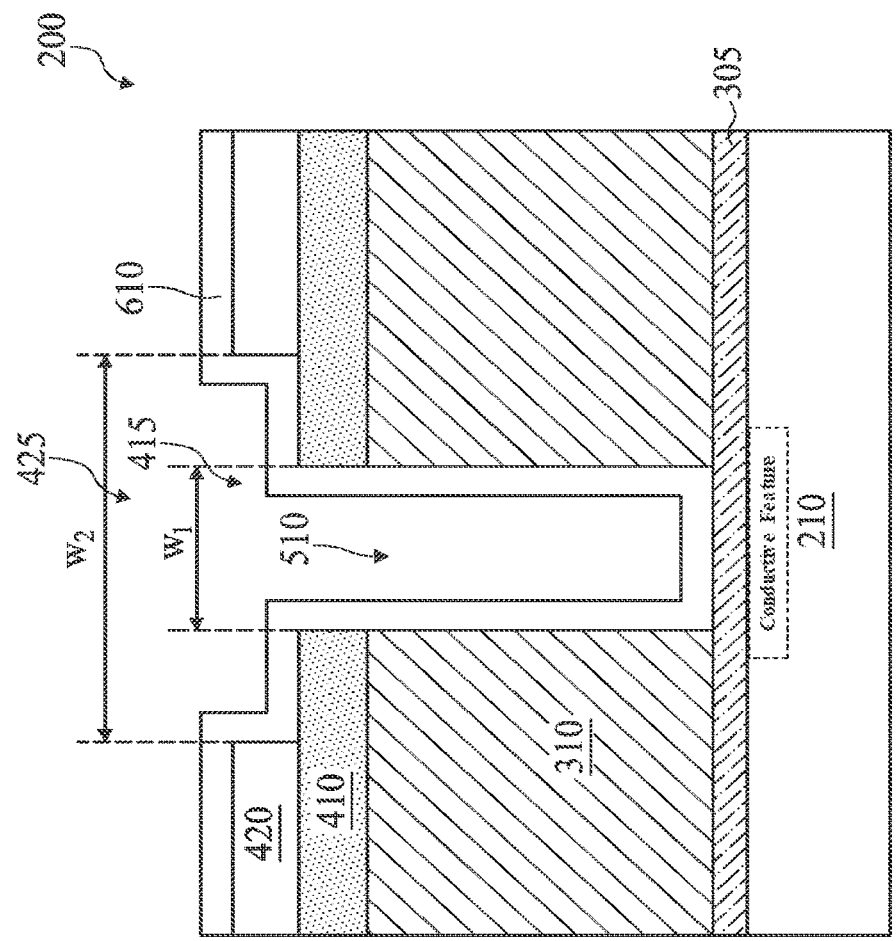

Referring to FIGS. 1 and 4, method 100 proceeds to step 108 by forming a first dielectric capping layer 610 along sidewalls of the via trench 510. Typically, after forming a trench (e.g. via trench 510) through an extra-low-K dielectric material (e.g. material layer 310) additionally etching processes are performed on the extra-low-K dielectric material which degrades/changes the trench profile. This changing trench profile leads to adverse impacts on device performance, such as high via resistance.

To prevent at least a portion of the profile of via trench 510 from changing during subsequent processing, the present disclosure forms a protection layer (or capping layer) along the sidewalls and bottom of the via trench 510. Specifically, as shown in FIG. 4, the first dielectric capping layer 610 is formed along sidewalls and the base of the via trench 510 to assist in protecting/maintaining at least a portion of the profile of via trench 510 during subsequent etch processes. The first dielectric capping layer 610 includes a material that it is different from the material layer 310 to achieve etching selectivity during subsequent etch processes and has lower polymer formation tendency than the material layer 310 during subsequent etch processes. In some embodiments, a silicon nitride capping layer 610 is formed along sidewalls of the via trench 510 in the extra-low-K dielectric layer 310. Alternatively, a silicon oxynitride capping layer 610 is formed along sidewalls and bottom of the via trench 510 formed in the extra-low-K dielectric layer 310. In some embodiments, the first dielectric capping layer 610 may include non-carbon-containing materials for polymer buildup reduction. The first dielectric capping layer 610 may be formed by CVD, PVD, ALD, and/or other suitable techniques. In an embodiment, the first dielectric capping layer 610 is formed by ALD process to achieve a conformal sidewall coverage along sidewalls of the via trench 510. The first dielectric capping layer 610 is also deposited over portions of the first and second patterned HMs, 410 and 420, which will be removed during subsequent etch processes.

The first dielectric capping layer 610 may be formed by CVD, PVD, ALD, and/or other suitable techniques. In an embodiment, the first dielectric capping layer 610 is formed by ALD process to achieve a conformal sidewall coverage along sidewalls of the via trench 510. The first dielectric capping layer 610 is also deposited over portions of the first and second patterned HMs, 410 and 420, which will be removed during subsequent etch processes.

Figure 5:
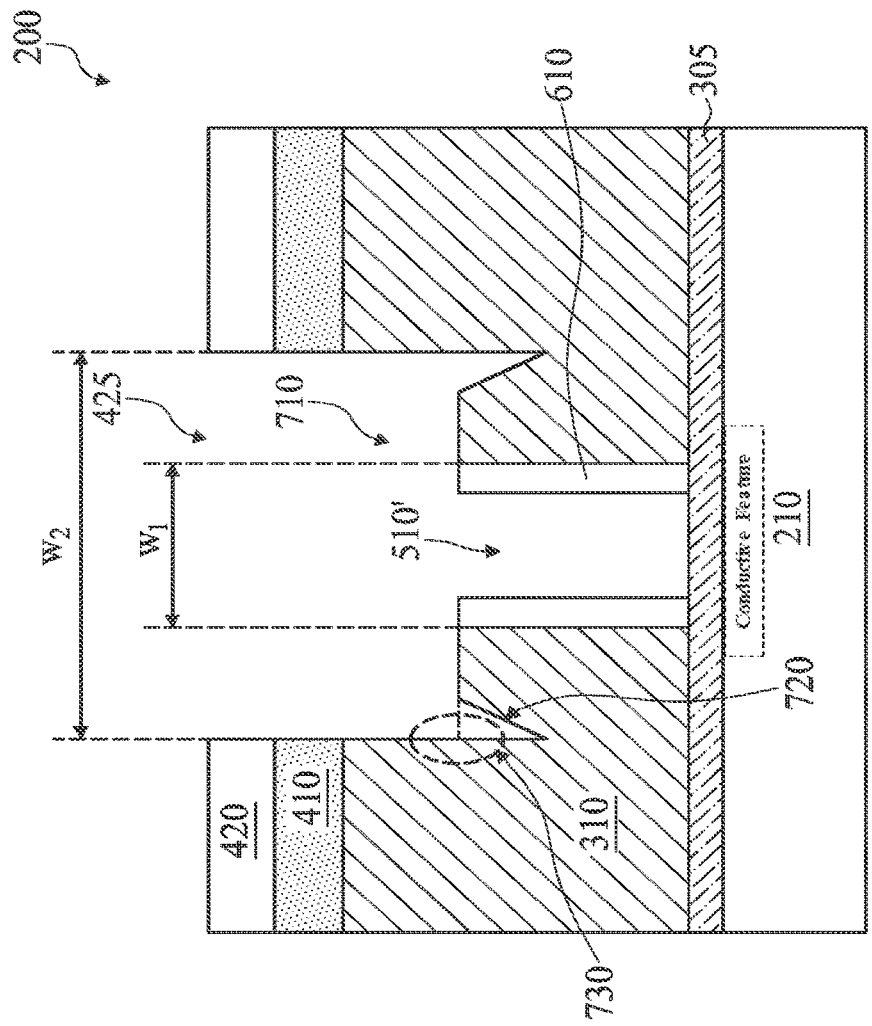

Referring to FIGS. 1 and 5, method 100 proceeds to step 110 by etching the first patterned HM 410 and the material layer 310 through the second opening 425 to form a trench 710 (or second trench). The upper portion of the via trench 510 is etched away while a lower portion of the via trench 510' (or remaining via trench 510') remains covered by the first dielectric capping layer 610. In some embodiment, etch depth is controlled such that the trench 710 is formed in an upper portion of the material layer 310 and aligns and connects with the remaining via trench 510.

The trench etch process may include a wet etch, a dry etch, and/or a combination thereof. For example, a dry etching process may use chlorine-containing gases, fluorine-containing gases, other etching gases, or a combination thereof. The wet etching solutions may include $NH_4OH$ (ammonium hydroxide), HF (hydrofluoric acid) or diluted HF, deionized water, TMAH (tetramethylammonium hydroxide), other suitable wet etching solutions, and/or combinations thereof. The trench etch process may be tuned with various etching parameters, such as etchant used, etching temperature, etching solution concentration, etching pressure, etchant flow rate, and/or other suitable parameters. In some embodiment, the trench etch process may include a selective anisotropic dry etch that etches the exposed first HM 410 and the material layer 310 through the second opening 425, without substantially etching the first dielectric capping layer 610 along sidewalls of the remaining via trench 510'. In an embodiment, the dry etch process uses a fluorine-based chemistry, such as $CF_4$, $SF_6$, $CH_2F_2$, $CHF_3$, and/or $C_2F_6$.

As has been mentioned above, the first dielectric capping layer 610 protects/maintains the profile of remaining via trench 510' during the etching process occurring at step 110. In that regard, the first dielectric capping layer 610 protects the material 310 forming/defining remaining via trench 510' from exposure to the etching solution/gases. This in turn, avoids/prevents the material layer 310 forming/defining remaining via trench 510' from reacting with etching solutions/gases that otherwise would form a polymer buildup on the material 310 and thereby degrade/change the profile of the trench. That is, with its low polymer formation tendency (e.g. non-carbon-containing material) the first dielectric capping layer 610 reduces or prevents polymer buildup along sidewalls of the remaining via trench 510'. As a result, the sidewall profile and width of the remaining via trench 510' is preserved. In a particular embodiment, the silicon nitride capping layer 610 preserves the sidewall profile and width of the remaining via trench 510' formed in the extra-low-K dielectric layer 310 and prevents polymer buildup along sidewalls of the remaining via trench 510' during a dry etch process using a fluorine-based chemistry, such as $CF_4$, $SF_6$, $CH_2F_2$, $CHF_3$, and/or $C_2F_6$.

Referring again to FIG. 5, during the trench etching process, it is common that additional unintended sub-trenches 720 (or tiger-teeth sub-trenches 720) are formed. As shown, sub-trenches 720 extend into the material layer 310 at trench corners 730 of (the corner of the trench 710 positioned away from the remaining via trench 510'). The formation of the sub-trench 720 are caused by a higher etch rate at trench corners 730 (e.g. due to a high film stress in trench corners 730). Thus, when a conductive layer fills in the sub-trench 720, it raises concerns for a potential weak insulation spot between the conductive layer and the substrate 210. The present disclosure will provide a method of smoothing out sub-trenches 720 to address such weak spots.

Figure 6:
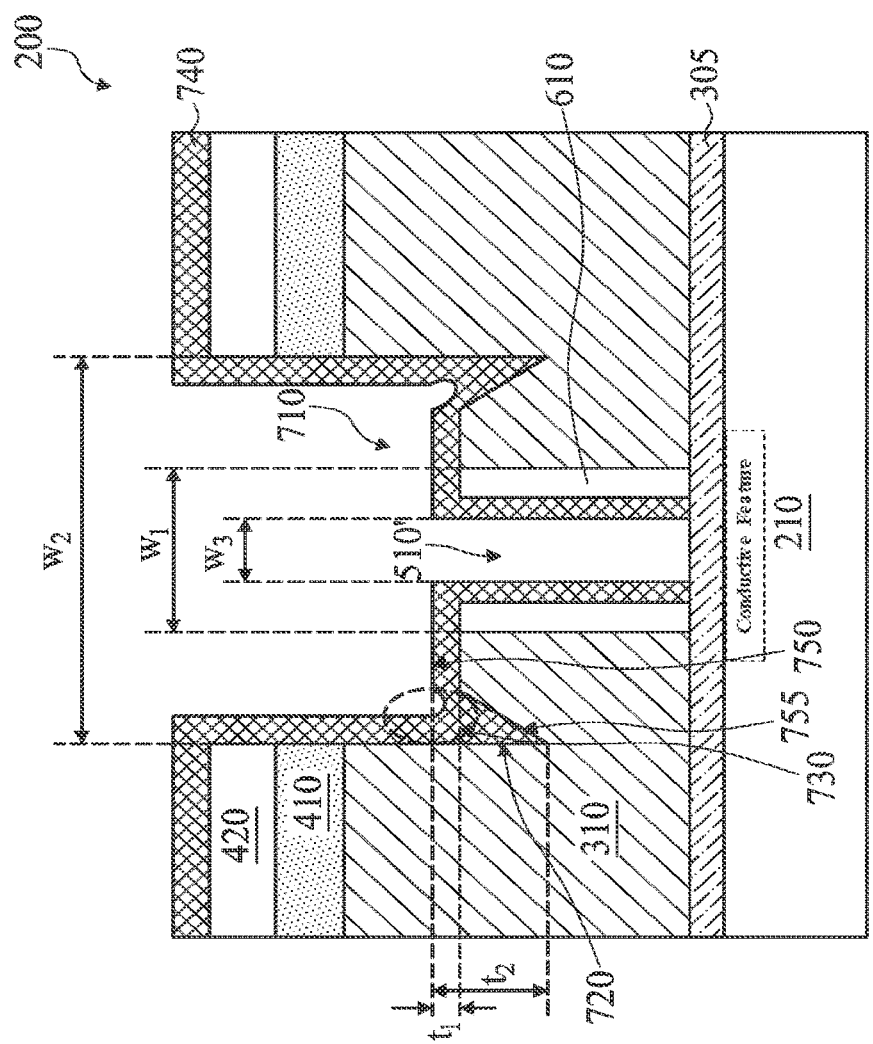

Referring to FIGS. 1 and 6, method 100 proceeds to step 112 by filling in the sub-trenches 720, as well as the via trench 510 and the trench 710, with a second dielectric capping layer 740. In the present embodiment, the second dielectric capping layer 740 fills in the sub-trench 720 thereby providing a smooth (or mostly planar) top contour 750 for the second dielectric capping layer 740 at trench corners 730. In other words, at trench corners 730, the second dielectric capping layer 740 has the smooth top contour 750 and a tiger-tooth bottom contour 755 by filling in sub-trenches 720 with a second dielectric material. Therefore, at trench corners 730, the second dielectric capping layer 740 has a second thickness $t_2$, which is substantial greater than a first thickness $t_1$ of the second dielectric capping layer 740 at rest of places. The second dielectric capping layer 740 is formed similarly in many respects to the first dielectric capping layer 610 discussed above association with FIG. 4, including the materials discussed therein. In an embodiment, the second dielectric capping layer 740 is deposited by ALD to comfortably fill in the sub-trenches 720. In some embodiments, the second dielectric capping layer 740 is formed of the same material as the first dielectric capping layer 610. In other embodiments, the second dielectric capping layer 740 is formed of a different than the first dielectric capping layer 610.

Referring again to FIG. 6, in the present embodiment, with the first dielectric capping layer 610 and second dielectric capping layer 740 disposed along sidewalls of remaining via trench 510', the width of the via trench 510 is reduced from the first width $w_1$ to a third width $w_3$. Thus, instead of using a lithography process and etching process, a dimension of the remaining via trench 510' may be further reduced by forming the first and the second dielectric capping layers, 610 and 740, along sidewalls of the remaining via trench 510'. As discussed below, the first dielectric capping layer 610 and second dielectric capping layer 740 allow for the remaining portion of via trench 510 to maintain width $w_3$ during subsequent etchings.

Figure 7:
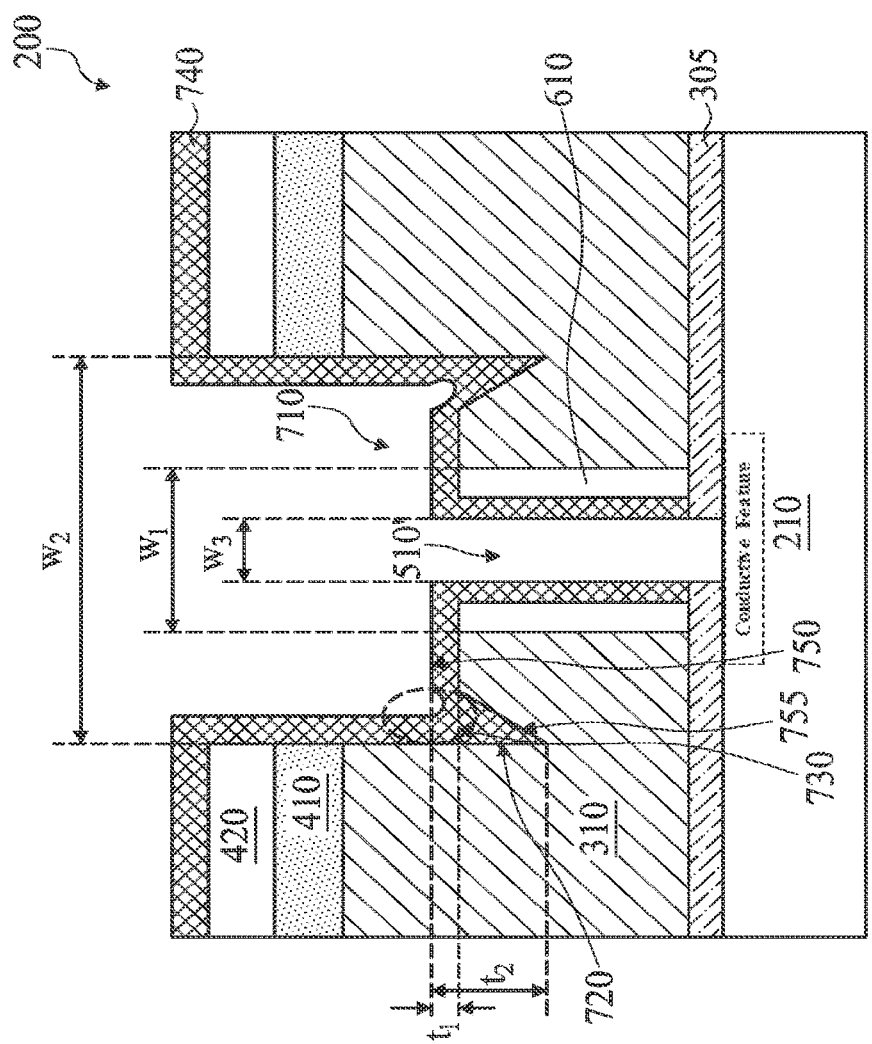

Referring to FIGS. 1 and 7, method 100 proceeds to step 114 by etching the ESL 305 to extend the remaining via trench 510' through the ESL 305 and expose the substrate 210 within the remaining via trench 510'. The ESL 305 may be etched by a wet etch, a dry etch, and/or a combination thereof. In some embodiments, the ESL 305 is etched by a selective etch which etches the ESL 305 without substantially etching the material layer 310 and the second dielectric capping layer 740. In the present embodiment, sidewalls of the remaining via trench 510' are covered by the first and second dielectric capping layers, 610 and 740, during etching of the ESL 305 which prevents polymer buildup along the sidewalls of the remaining via trench 510' and thereby preserves via trench's profile and via trench's width, namely the third width $w_3$.

Figure 8A:
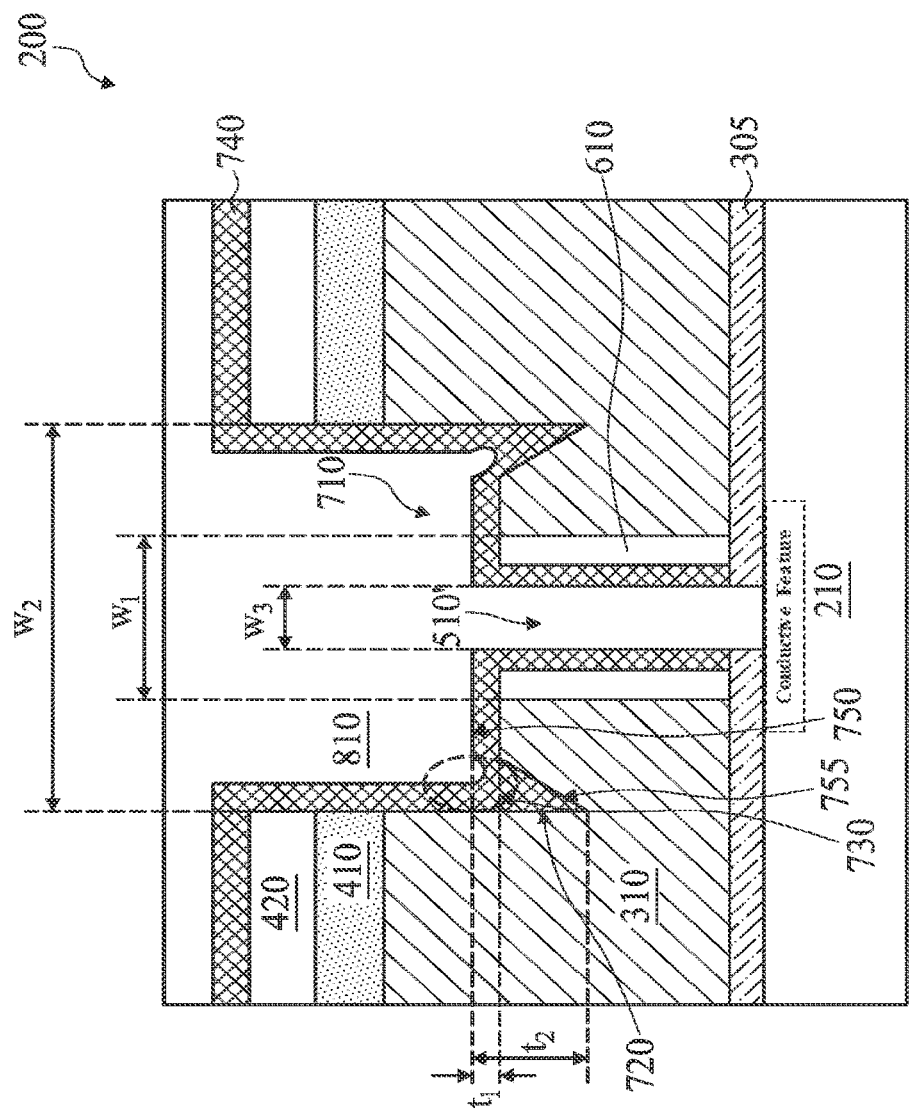

Referring to FIGS. 1 and 8A, method 100 proceeds to step 116 by filling in the trench 710 and the remaining via trench 510' with a conductive material 810. The conductive material 810 may include seed layers, liner layers, and/or other multi-layer structures. In some embodiments, prior to forming the conductive material 810, a barrier layer (not shown) is formed first. The barrier layer may include a metal and is electrically conductive but does not permit inter-diffusion and reactions between the material layer 310 (including the first and second dielectric capping layers, 610 and 740) and conductive material 810 to be filled in the remaining via trench 510' and the trench 710. The barrier layer may include refractory metals and their nitrides. In various examples, the first barrier layer includes TiN, TaN, Co, WN, TiSiN, TaSiN, or combinations thereof. The first barrier layer may include multiple films.

The conductive material 810 then fills in the remaining via trench 510' and the trench 710. The conductive material 810 may include metallic nitrides, elemental metals, and/or combinations thereof. Example compositions include copper (Cu), tungsten (W), titanium (Ti), aluminum (Al), hafnium (Hf), molybdenum (Mo), scandium (Sc), yttrium (Y), nickel (Ni), platinum (Pt), and/or other suitable metals. Example metal nitride compositions include titanium nitride (TiN), tantalum nitride (TaN), tungsten nitride (WN), and/or other suitable metal nitrides. The barrier layer and the conductive material 810 may be formed using one or more deposition steps, such as, ALD, PVD, CVD, plating (ECP), and/or other suitable processes. In an embodiment, the remaining via trench 510' and the trench 710 are filled contemporaneously with the same conductive material 810.

Figure 8B:
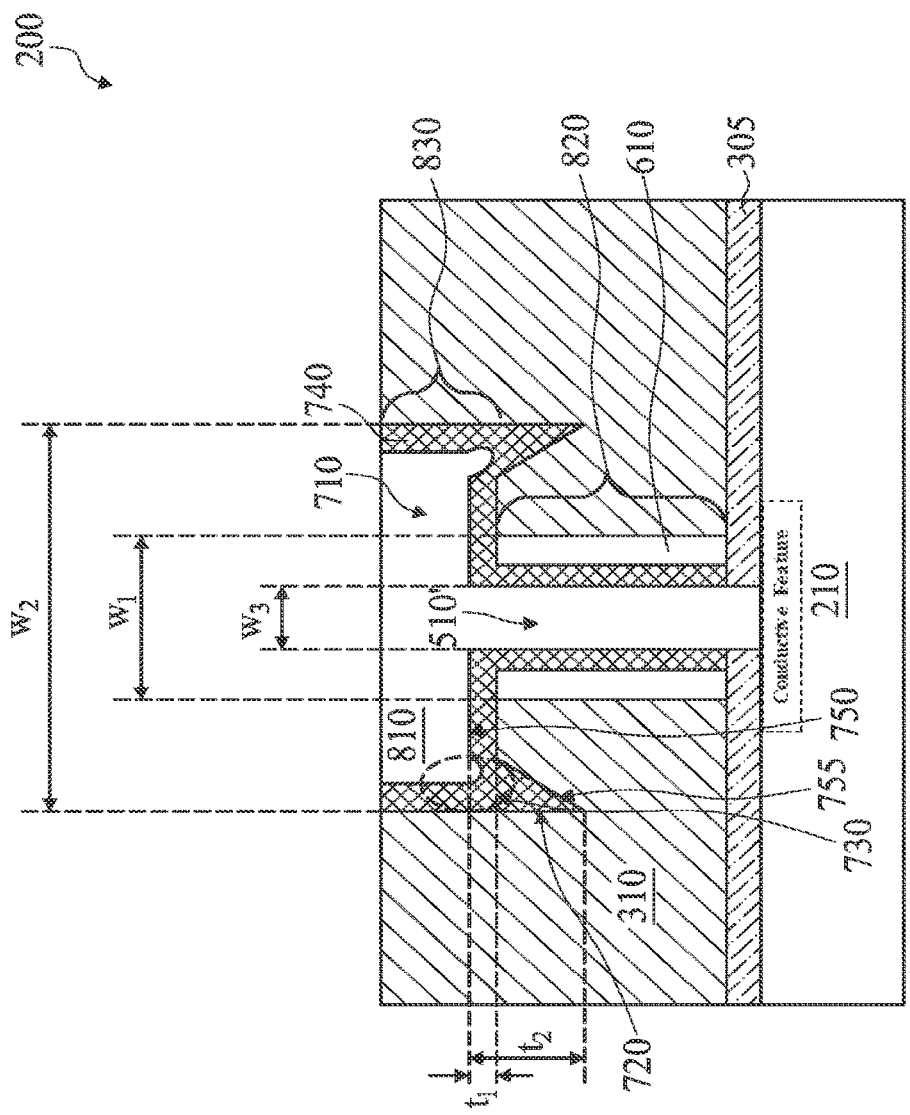

In some embodiments, after the deposition of the conductive material 810, a planarization process, such as a chemical mechanical polishing (CMP) process, to be performed to planarize the top surface of the conductive material 810. In some embodiments, the CMP process used to planarize the top surface of the conductive material 810 may also serve to remove the second dielectric capping layer 740, the first and second HMs, 410 and 420. The conductive material 810 remains within the remaining via trench 510' and the trench 710 forms a via feature 820 and a conductive line 830, respectively, as shown in FIG. 8B.

Referring again to FIG. 8B, the via feature 820 carries vertical profile of the remaining via trench 510' and has the first and second dielectric capping layers, 610 and 740, along its sidewalls. In other word, the via feature 820 is separated from the material layer 310 by the first and second dielectric capping layers, 610 and 740. The via feature 820 extends down and physically contacts to the substrate 210. The second dielectric capping layer 740 disposed along sidewalls of the conductive line 830 and along portions of the bottom of the conductive line 830. Another bottom of the conductive line 830 physically contacts to the via feature 820. At trench corners 730, the sub-trenches 720 in the material layer 310 are filled in with the second dielectric capping layer 740. In other word, at trench corners 730, the second dielectric capping layer 740 has a smooth top contour 750 and a tiger-teeth-like bottom contour 755. Therefore, at the trench corners 730, the second dielectric capping layer 740 has the second thickness $t_2$ while it has the first thickness $t_1$ at other places. The conductive line 830 (with the second dielectric capping layer 740 along its sidewalls) has the second width $w_2$ while the via feature 820 has the third width $w_3$, which is substantially smaller than the second width $w_2$. The via feature 820 may be referred to as Vx, while the conductive line 830 may be referred to as Mx+1, where x is the layer of the back-end metallization process.

Additional process steps may be implemented before, during, and after method 100, and some process steps described above may be replaced or eliminated in accordance with various embodiments of method 100.

Based on the above, it can be seen that the present disclosure provides methods of forming a second trench over an existing first trench. The method employs forming a capping layer along sidewalls of the existing first trench to protect it during forming the second trench. The method also employs forming another capping layer after forming the second trench to improve trench contour at trench corners. With quite simple and feasible process integration, the method preserves sidewall profile and width of the existing first trench and improved trench profile of the second trench.

The present disclosure provides many different embodiments of a method of forming a device. The method includes forming a material layer over a substrate, forming a first trench in the material layer and the first trench has a first width. The method also includes forming a first dielectric capping layer along sidewalls of the first trench and the first dielectric capping layer has a different etch rate than the material layer. The method also includes forming a second trench in the material layer while the capping layer disposed along sidewalls of the first trench. The second trench has a second width which is greater than the first width and the second trench aligns with and is in communication with the first trench. The method also includes forming a second dielectric capping layer along sidewalls of the second trench and along the sidewalls of the first trench and forming a conductive feature within the second trench and the first trench.

In another embodiment, a method includes forming a dielectric layer over a substrate, forming a first patterned hard mask over the dielectric layer and the first patterned hard mask has a first opening having a first width. The method also includes forming a second patterned hared mask over the first patterned hard mask and the second patterned hard mask has a second opening having a second width which is greater than the first width. The method also includes etching the dielectric layer through the first opening to form a first trench in the dielectric layer and forming a first dielectric capping layer along sidewalls of the first trench. The first dielectric capping layer has a different etch rate than the dielectric layer. The method also includes etching the dielectric layer through the second opening to form a second trench while the first dielectric capping layer is disposed along sidewalls of the first trench, wherein the second trench is in communication with first trench. The method also includes forming a second dielectric capping layer along sidewalls of the second trench and the sidewalls of the first trench and the second dielectric capping layer has a different etch rate than the dielectric layer. The method also includes forming a conductive feature within the first trench and the second trench.

In yet another embodiment, a device includes a dielectric layer over a substrate and a conductive feature disposed in the dielectric layer and physically contacting the substrate. The conductive feature includes a first portion having a first width and a second portion having a second width, which is greater than the first width. The device also includes a first dielectric capping layer disposed along sidewalls of the first portion and a second dielectric capping layer disposed along sidewalls of the second portion and along sidewalls of the first portion. A portion of the second dielectric capping layer is disposed under the second portion of the conductive feature such that a first segment of the portion of the second dielectric capping layer has a first thickness and a second segment of the portion of the second dielectric capping layer has a second thickness that is different than the first thickness.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
a multi-layer interconnect (MU) structure that includes an interconnecting conductive feature disposed in a first dielectric layer;
a second dielectric layer disposed between the first dielectric layer and sidewalls of a first portion of the interconnecting conductive feature, between the first dielectric layer and a bottom of the first portion of the interconnecting conductive feature, and between the first dielectric layer and sidewalls of a second portion of the interconnecting conductive feature, wherein the first portion of the interconnecting conductive feature is disposed over the second portion of the interconnecting conductive feature, and further wherein the second dielectric layer includes:
a tiger-tooth contour formed by first segments that extend along and substantially parallel with the sidewalls of the first portion of the interconnecting conductive feature, second segments that extend along and substantially parallel with the bottom of the first portion of the interconnecting conductive feature, and third segments that extend between respective first segments and respective second segments, such that the second dielectric layer has a tapered thickness at corners of the interconnecting conductive feature, and
a smooth contour formed by fourth segments that extend along and substantially parallel with the sidewalls of the second portion of the interconnecting conductive feature, wherein the fourth segments extend from respective second segments; and
a third dielectric layer disposed between the first dielectric layer and the second dielectric layer along sidewalls of the second portion of the interconnecting conductive feature, wherein a material of the first dielectric layer is different than a material of the second dielectric layer and a material of the third dielectric layer.

2. The device of claim 1, wherein the third dielectric layer has a smooth contour formed by fifth segments that extend along and substantially parallel with the sidewalls of the second portion of the interconnecting conductive feature.

3. The device of claim 1, wherein the second dielectric layer extends continuously along one of the sidewalls of the first portion of the interconnecting conductive feature to a portion of the bottom of the first portion of the interconnecting conductive feature to one of the sidewalls of the second portion of the interconnecting conductive feature.

4. The device of claim 1, wherein the material of the second dielectric layer and the material of the third dielectric layer include silicon and nitrogen.

5. The device of claim 1, wherein the material of the first dielectric layer has a different etching characteristic than the material of the second dielectric layer and the material of the third dielectric layer.

6. The device of claim 1, wherein the second portion of the interconnecting conductive feature includes a portion disposed in an etch stop layer.

7. The device of claim 1, wherein a width of the first portion of the interconnecting conductive feature is greater than a width of the second portion of the interconnecting conductive feature.

8. The device of claim 1, wherein the first portion of the interconnecting conductive feature is a conductive line of the MLI structure and the second portion of the interconnecting conductive feature is a via of the MLI structure.

9. The device of claim 1, wherein a thickness of the second dielectric layer increases from a point where the third segments connect to the respective first segments and a point where the third segments connect to the respective second segments.

10. A device comprising:
a first metal feature configured as a via of a multi-layer interconnect (MLI) structure;
a second metal feature disposed over and physically contacting the first metal feature, wherein the second metal feature is configured as a conductive line of the MLI structure disposed over the via, wherein the first metal feature and the second metal feature are disposed in a dielectric layer of the MLI structure;
a first dielectric liner layer having:
first sidewall portions disposed between the dielectric layer and first sidewalls of the first metal feature, wherein the first sidewall portions physically contact the first sidewalls of the first metal feature,
second sidewall portions disposed between the dielectric layer and second sidewalls of the second metal feature, wherein the second sidewall portions physically contact the dielectric layer and the second sidewalls of the second metal feature,
bottom portions that connect the first sidewall portions to the second sidewall portions, wherein the bottom portions are not disposed along the second sidewalls of the second metal feature and the bottom portions physically contact the dielectric layer and a bottom of the second metal feature,
wherein a first thickness of the first sidewall portions of the first dielectric liner layer is substantially the same along the first sidewalls of the first metal feature and a second thickness of the second sidewall portions of the first dielectric liner layer is substantially the same along the second sidewalls of the second metal feature, and wherein a thickness of the bottom portions of the first dielectric liner layer at bottom corners of the second metal feature tapers from a third thickness that is greater than the second thickness to a fourth thickness that is less than the second thickness, such that the first dielectric liner layer has a tiger-tooth shape at bottom corners of the second metal feature; and a second dielectric liner layer disposed between the dielectric layer and the first sidewall portions of the first dielectric liner layer, wherein the second dielectric liner layer physically contacts the dielectric layer and the first sidewall portions of the first dielectric liner layer.

11. The device of claim 10, wherein a material of the first dielectric liner layer is the same as a material of the second dielectric liner layer.

12. The device of claim 10, wherein a material of the first dielectric liner layer is different than a material of the second dielectric liner layer.

13. The device of claim 10, wherein a thickness of the bottom portions of the first dielectric liner layer from the bottom corners of the second metal feature to the first sidewall portions is substantially the same along the bottom of the second metal feature.

14. The device of claim 10, wherein a conductive material of the second metal feature and the first metal feature extends without interruption between the second metal feature and the first metal feature.

15. The device of claim 10, wherein the dielectric layer includes an extra low-k dielectric material.

16. The device of claim 10, wherein the first dielectric liner layer and the second dielectric liner layer each include a material that minimizes polymer formation during etching.

17. A device comprising:
a dielectric layer over a substrate;
a first conductive feature disposed in the dielectric layer and physically contacting a second conductive feature disposed in the substrate, the first conductive feature including:
a first portion having a first width, and
a second portion disposed over the first portion, wherein the second portion has a second width that is greater than the first width;
a first dielectric capping layer disposed along and physically contacting an entirety of sidewalls of the second portion and along and physically contacting sidewalls of the first portion, wherein a portion of the first dielectric capping layer is further disposed along and physically contacting a bottom of the second portion, such that the first dielectric capping layer extends without interruption from the sidewalls of the second portion to the bottom of the second portion to the sidewalls of the first portion, and further wherein the portion of the first dielectric capping layer disposed along and physically contacting the bottom of the second portion has a first thickness proximate the sidewalls of the second portion and a second thickness proximate the sidewalls of the first portion, wherein the second thickness is greater than the first thickness; and
a second dielectric capping layer disposed between the dielectric layer and the first dielectric capping layer that is disposed along and physically contacting the sidewalls of the first portion.

18. The device of claim 17, wherein the first portion of the first conductive feature is separated from the dielectric layer by the first dielectric capping layer and the second dielectric capping layer, and the second portion of the first conductive feature is separated from the dielectric layer by the first dielectric capping layer.

19. The device of claim 17, wherein the first dielectric capping layer and the second dielectric capping layer each include a non-carbon-containing dielectric material.

20. The device of claim 17, wherein the first dielectric capping layer and the second dielectric capping layer are silicon nitride layers, and the dielectric layer is an extra low-k dielectric layer.

* * * * *